United States Patent
Yang et al.

(10) Patent No.: US 7,655,501 B2
(45) Date of Patent: Feb. 2, 2010

(54) WAFER LEVEL PACKAGE WITH GOOD CTE PERFORMANCE

(75) Inventors: Wen-Kun Yang, Hsin-Chu (TW); Tung-Chuan Wang, Taoyuan County (TW); Chao-Nan Chou, Taipei (TW); Chih-Wei Lin, Gueiren Township, Tainan County (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 30 days.

(21) Appl. No.: 12/141,138

(22) Filed: Jun. 18, 2008

(65) Prior Publication Data
US 2008/0248614 A1 Oct. 9, 2008

Related U.S. Application Data

(62) Division of application No. 11/609,970, filed on Dec. 13, 2006, now abandoned.

(51) Int. Cl.
*H01L 21/00* (2006.01)

(52) U.S. Cl. .................. 438/106; 438/118

(58) Field of Classification Search ............ 438/160, 438/107, 109, 110, 118, 622
See application file for complete search history.

(56) References Cited

U.S. PATENT DOCUMENTS

| 6,271,469 | B1 | 8/2001 | Ma et al. ............. 174/52.4 |
| 6,559,464 | B1* | 5/2003 | Flanders et al. ......... 250/548 |
| 6,917,525 | B2* | 7/2005 | Mok et al. ............. 361/767 |
| 7,349,223 | B2* | 3/2008 | Haemer et al. .......... 361/767 |
| 2007/0140627 | A1* | 6/2007 | Lu ...................... 385/89 |
| 2008/0171402 | A1* | 7/2008 | Karnezos ............... 438/15 |

* cited by examiner

*Primary Examiner*—S. V Clark
(74) *Attorney, Agent, or Firm*—Kusner & Jaffe

(57) ABSTRACT

The present invention provides a structure of package comprising a substrate with a pre-formed die receiving cavity formed and/or terminal contact metal pads formed within an upper surface of the substrate. A die is disposed within the die receiving cavity by adhesion and a dielectric layer formed on the die and the substrate. At least one re-distribution built up layer (RDL) is formed on the dielectric layer and coupled to the die via contact pad. Connecting structure, for example, UBM is formed over the re-distribution built up layer. Terminal Conductive bumps are coupled to the UBM.

10 Claims, 5 Drawing Sheets

Panel wafer form after processed before singulation

Pre-formed substrate with die cavity
(contact metal pads are not shown)

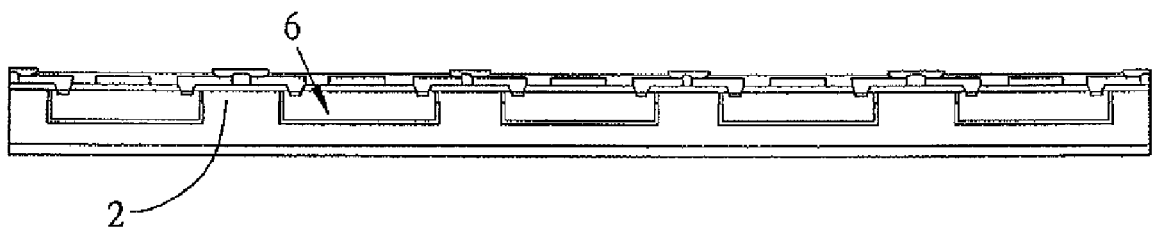
Panel wafer form after processed before singulation
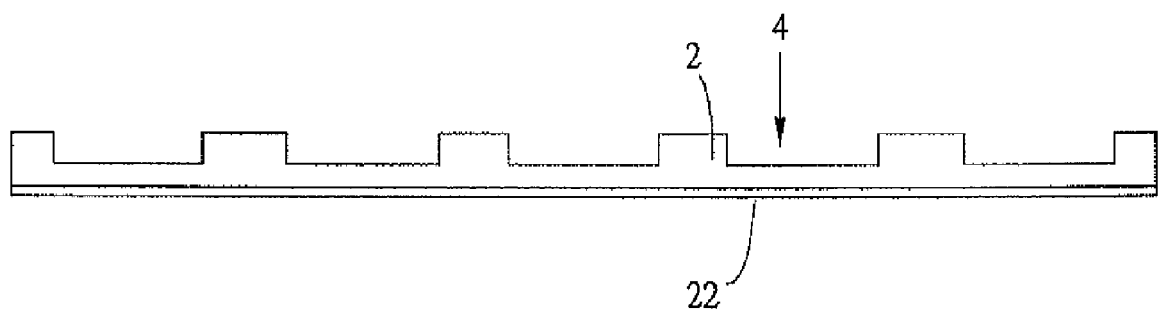
Pro-formed substrate with die cavity
(contact metal pads are not shown)
FIGURE 3

FIGURE 5 Substrate top view

WAFER LEVEL PACKAGE WITH GOOD CTE PERFORMANCE

RELATED APPLICATIONS

This application is a divisional of U.S. application Ser. No. 11/609,970, filed Dec. 13, 2006 now abandoned.

FIELD OF THE INVENTION

This invention relates to a structure of wafer level package (WLP), and more particularly to a wafer level package with good CTE performance.

DESCRIPTION OF THE PRIOR ART

In the field of semiconductor devices, the device density is increased and the device dimension is reduced, continuously. The demand for the packaging or interconnecting techniques in such high density devices is also increased to fit the situation mentioned above. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support . . . And so on. As a semiconductor become more complicated, the traditional package technique, for example lead frame package, flex package, rigid package technique, can't meet the demand of producing smaller chip with high density elements on the chip.

Furthermore, because conventional package technologies have to divide a dice on a wafer into respective dies and then package the die respectively, therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip (FC-BGA), chip scale package (CSP), Wafer level package (WLP) today. "Wafer level package" is to be understood as meaning that the entire packaging and all the interconnections on the wafer as well as other processing steps are carried out before the singulation (dicing) into chips (dies). Generally, after completion of all assembling processes or packaging processes, individual semiconductor packages are separated from a wafer having a plurality of semiconductor dies. The wafer level package has extremely small dimensions combined with extremely good electrical properties.

WLP technique is an advanced packaging technology, by which the die are manufactured and tested on the wafer, and then singulated by dicing for assembly in a surface-mount line. Because the wafer level package technique utilizes the whole wafer as one object, not utilizing a single chip or die, therefore, before performing a scribing process, packaging and testing has been accomplished; furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices.

Though the advantages of WLP technique mentioned above, some issues still exist influencing the acceptance of WLP technique. For instance, the CTE difference (mismatching) between the materials of a structure of WLP becomes another critical factor to mechanical instability of the structure. A package scheme disclosed by Intel U.S. Pat. No. 6,271,469 suffers the CTE mismatching issue. It is because the prior art uses silicon die encapsulated by molding compound. As known, the CTE of silicon material is 2.3, but the CTE of molding compound is around 20-40. The arrangement causes chip location be shifted during process due to the curing temperature of compound and dielectric layers materials are higher and the inter-connecting pads will be shifted that will causes yield and performance problem. It is difficult to return the original location during temperature cycling (it caused by the epoxy resin property if the curing Temp near/over the Tg). It means that the prior structure package can not be processed by large size, and it causes higher manufacturing cost.

Further, some technical involves the usage of die that directly formed on the upper surface of the substrate. As known, the pads of the semiconductor die will be redistributed through redistribution processes involving a redistribution layer (RDL) into a plurality of metal pads in an area array type. The build up layer will increase the size of the package. Therefore, the thickness of the package is increased. This may conflict with the demand of reducing the size of a chip.

Further, the prior art suffers complicated process to form the "Panel" type package. It needs the mold tool for encapsulation and the injection of mold material. It is unlikely to control the surface of die and compound at same level due to warp after heat curing the compound, the CMP process may be needed to polish the uneven surface. The cost is therefore increased.

Therefore, the present invention provides a FO-WLP structure with good CTE performance and shrinkage size to overcome the aforementioned problem and also provide the better board level reliability test of temperature cycling.

SUMMARY OF THE INVENTION

The object of the present invention is to provide a WLP with good CTE performance and shrinkage size.

The further object of the present invention is to provide a WLP with a substrate having die receiving cavity for shrinking the device size.

The further object of the present invention is to provide a dielectric layer formed on the die and the substrate and refill into a gap between the die and the substrate to absorb thermal mechanical stress there between, wherein the dielectric layer includes an elastic dielectric layer, a photosensitive layer, a silicone dielectric based layer, siloxane polymer (SINR) layer, a polyimides (PI) layer or silicone resin layer.

The present invention provides a structure of package comprising a substrate with a pre-formed die receiving cavity formed and/or terminal contact metal pads (for FR5/BT substrate) within an upper surface of the substrate. A die is disposed within the die receiving cavity by adhesion and a dielectric layer formed on the die and the substrate. At least one re-distribution built up layer (RDL) is formed on the dielectric layer and coupled to the die via contact pad. Connecting structure, for example, UBM is formed over the re-distribution built up layer and on the terminal contact metal pads. Terminal Conductive bumps are coupled to the UBM.

The dielectric layer includes an elastic dielectric layer, silicone dielectric based material, BCB or PI. The silicone dielectric based material comprises siloxane polymers (SINR), Dow Corning WL-5000 series, or composites thereof. Alternatively, the dielectric layer comprises a photosensitive layer. The dielectric layer is formed on the die and the substrate and refill into a gap between the die and the substrate to absorb thermal stress there between, wherein the dielectric layer includes an elastic dielectric layer, a photosensitive layer, a siloxane polymer (SINR) layer, a polyimides (PI) layer or silicone resin layer.

The material of the substrate includes organic epoxy type FR4, FR5, BT (Bismaleimide Triazine epoxy), PCB (print circuit board), PI (Polyimide type), alloy or metal. The alloy includes Alloy42 (42% Ni-58% Fe) or Kovar (29% Ni-17% Co-54% Fe). Alternatively, the substrate could be glass, ceramic or silicon.

BRIEF DESCRIPTION OF THE DRAWINGS

FIG. 3 illustrates a cross-sectional view of a structure of fan-out WLP according to the present invention.

DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying claims.

The present invention discloses a structure of WLP utilizing a substrate having predetermined terminal contact metal pads 3 formed thereon and a pre-formed cavity 4 formed into the substrate 2. A die is disposed within the die receiving cavity by adhesion. A photosensitive material is coated over the die and the pre-formed substrate. Preferably, the material of the photosensitive material is formed of elastic material.

Figure 1:
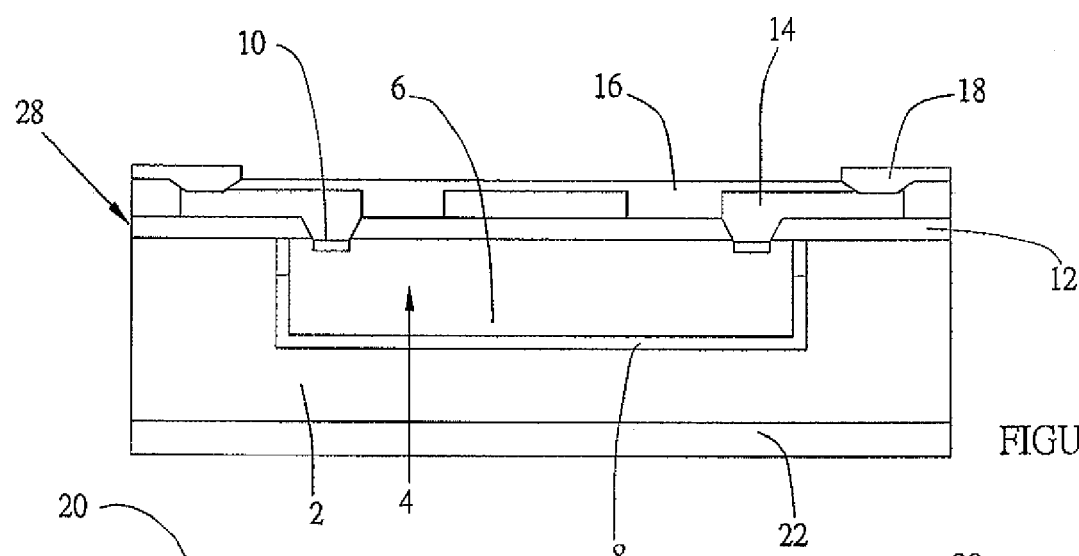
FIG. 1 illustrates a cross-sectional view of a structure of fan-out WLP according to the present invention.

FIG. 1 illustrates a cross-sectional view of Fan-Out Wafer Level Package (FO-WLP) in accordance with one embodiment of the present invention. As shown in the FIG. 1, the structure of FO-WLP includes a substrate 2 having a terminal contact metal pads 3 (for organic substrate) and die receiving cavity 4 formed therein to receive a die 6. The cavity 4 is pre-formed within the substrate 2. A cover 22 is formed under the lower surface of the substrate 2 for laser mark or protection. The material includes epoxy.

The die 6 is disposed within the die receiving cavity 4 on the substrate 2 and fixed by an adhesion material 8 (preferably, elastic based materials). As know, contact pads (Bonding pads) 10 are formed on the die 6. A photosensitive layer or dielectric layer 12 is formed over the die 6 and filling into the space between the die 6 and the sidewalls of the cavity 4. Pluralities of openings are formed within the dielectric layer 12 through the lithography process or exposure and develop procedure. The pluralities of openings are aligned to the contact pads or I/O pads 10 and terminal contact metal pads 3 (refer to FIG. 2), respectively. The RDL (re-distribution layer) 14, also referred to as conductive trace 14, is formed on the dielectric layer 12 by removing (seed layers) selected portions of metal layer formed over the layer 12, wherein the RDL 14 keeps electrically connected with the die 6 through the I/O pads 10 and terminal contact metal pads 3. A part of the material of the RDL will re-fills into the openings in the dielectric layer 12. A protection layer 16 is formed to cover the RDL 14. Terminal pads 18 are located on the protection layer 16 and connected to the RDL 14 and terminal contact metal pads 3 of substrate. A scribe line 28 is defined between the units 2 for separating each unit 2, any there is no dielectric layer (optional).

The dielectric layer 12 is formed atop of the die 6 and substrate 2 and fills the space surrounding the die 6; due to the dielectric layer 12 is elastic property, it acts as buffer area can absorb the thermal mechanical stress between the die 6 and substrate 2 during temperature cycling. The aforementioned structure constructs LGA type package. An alternative embodiment can be seen in FIG. 2, Conductive balls 20 are formed on the terminal pads 18. This type is called BGA type. The other parts are similar to FIG. 1, therefore, the detailed description is omitted. The terminal pads 18 act as the UBM (under ball metal) under the BGA scheme. Pluralities of terminal contact conductive pads 3 are formed on the upper surface of the substrate 2 and under the RDL 14.

Preferably, the material of the substrate 2 is organic substrate likes FR5, BT, PCB with defined cavity or Alloy42 with pre etching circuit. Preferably, the organic substrate with high Glass transition temperature (Tg) are epoxy type FR5 or BT (Bismaleimide triazine) type substrate. The Alloy42 is composed of 42% Ni and 58% Fe. Kovar can be used also, and it is composed of 29% Ni, 17% Co, 54% Fe. The glass, ceramic, silicon can be used as the substrate.

It is because that the CTE (X/Y direction) of the epoxy type organic substrate (FR5/BT) is around 16 and the CTE of the Tool of chip redistribution around is around 5 to 8 by employing the glass materials as the tool. The FR5/BT can not return to original location after the temperature cycling (near to Glass transition temperature Tg) that causes the die shift in panel form during the WLP process which needs several high temperature process. For example, the dielectric layers formation, the heat curing die attached materials etc., the following process steps and tool are to make sure organic substrate can keep the original location and no any warp happen during process.

Please refer to FIG. 3, the substrate could be round type such as wafer type, the diameter could be 200, 300 mm or higher. It could be employed for rectangular type such as panel form. FIG. 3 illustrates the substrate 2 for the panel wafer form after process but before singulation. As can be seen from the drawings, the substrate 2 is pre-formed with cavities 4. In the upper portion of FIG. 4, the units of FIG. 1 are arranged in a matrix form. A scribe line 28 is defined between the units 2 for separating each unit 2.

Figure 4:
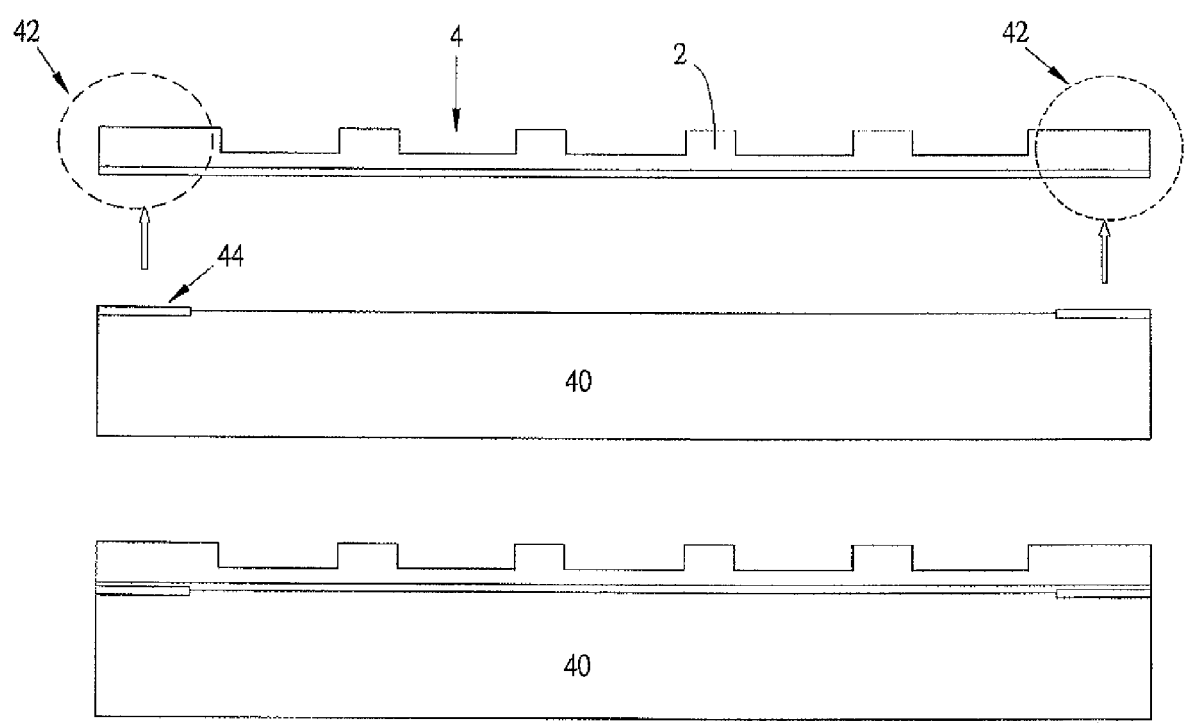
FIG. 4 illustrates a cross-sectional view of the combination of the substrate and the tool according to the present invention.
Figure 5:
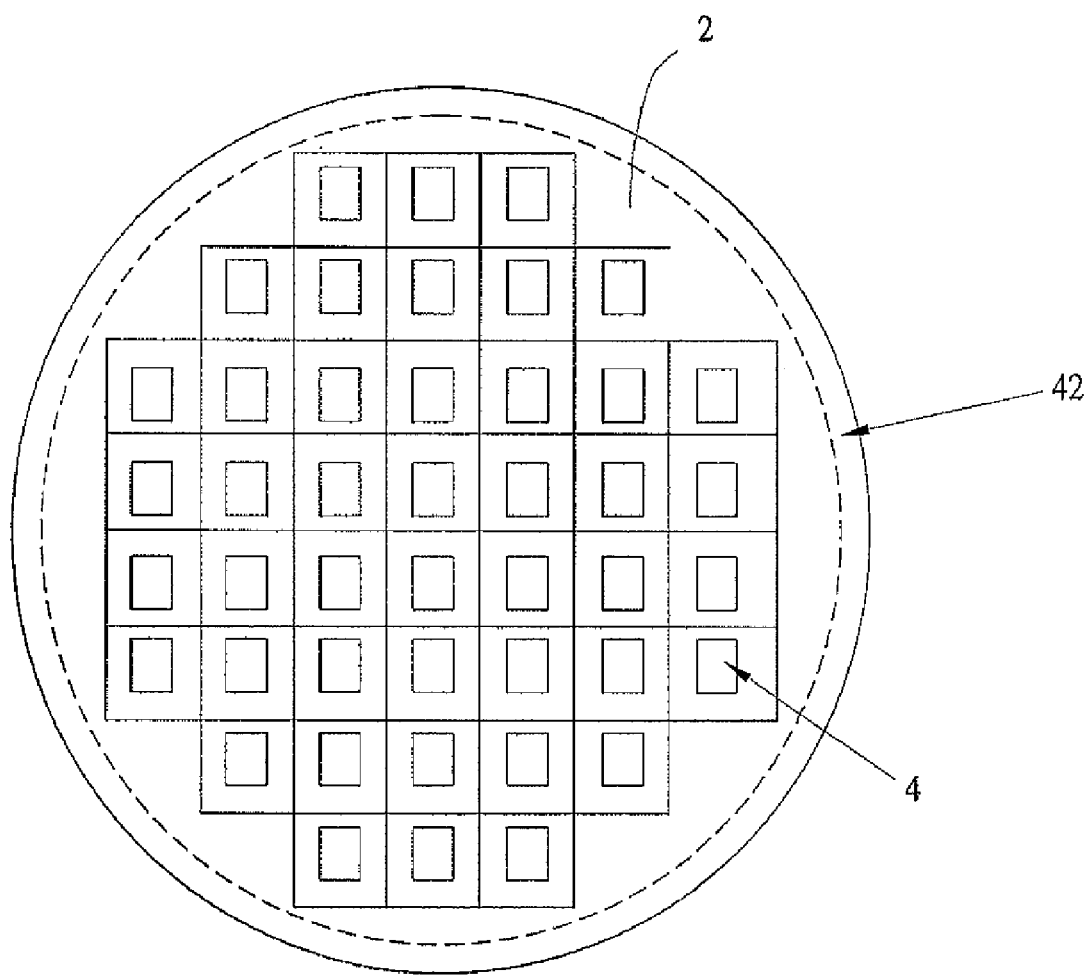
FIG. 5 illustrates a top view of the combination of the substrate and the tool according to the present invention.

Please refer to FIG. 4, there is no cavity 4 formed at the peripheral (edge) area 42 of the substrate 2. A glass carrier tool 40 with adhesive material (preferably UV curing type) 44 formed at the peripheral area of the glass tool for (adhesion) handling organic substrate during WLP process. The lower portion of the FIG. 4 is the combination of the glass carrier tool 40 and the substrate 2 after bonding and UV curing. FIG. 5 shows that the edge area of substrate 2 does not include the die cavity, the periphery area will be used for sticking the glass carrier during WLP process. The substrate will be adhered with glass carrier and it will be stuck and hold the substrate during process. After the WLP process is completed, the area indicated by the dot line will be cut from the glass carrier, it means that the inner area defined by the dot line will be performed the sawing process for package singulation.

In one embodiment of the present invention, the dielectric layer 12 is preferably an elastic dielectric material which is made by silicone dielectric based materials comprising siloxane polymers (SINR), Dow Coming WL5000 series, and composites thereof. In another embodiment, the dielectric layer is made by a material comprising, polyimides (PI) or silicone resin. Preferably, it is a photosensitive layer for simple process.

In one embodiment of the present invention, the elastic dielectric layer is a kind of material with CTE larger than 100 (ppm/° C.), elongation rate about 40 percent (preferably 30 percent-50 percent), and the hardness of the material is between plastic and rubber. The thickness of the elastic dielectric layer 18 depends on the stress accumulated in the RDL/dielectric layer interface during temperature cycling test.

Figure 6:
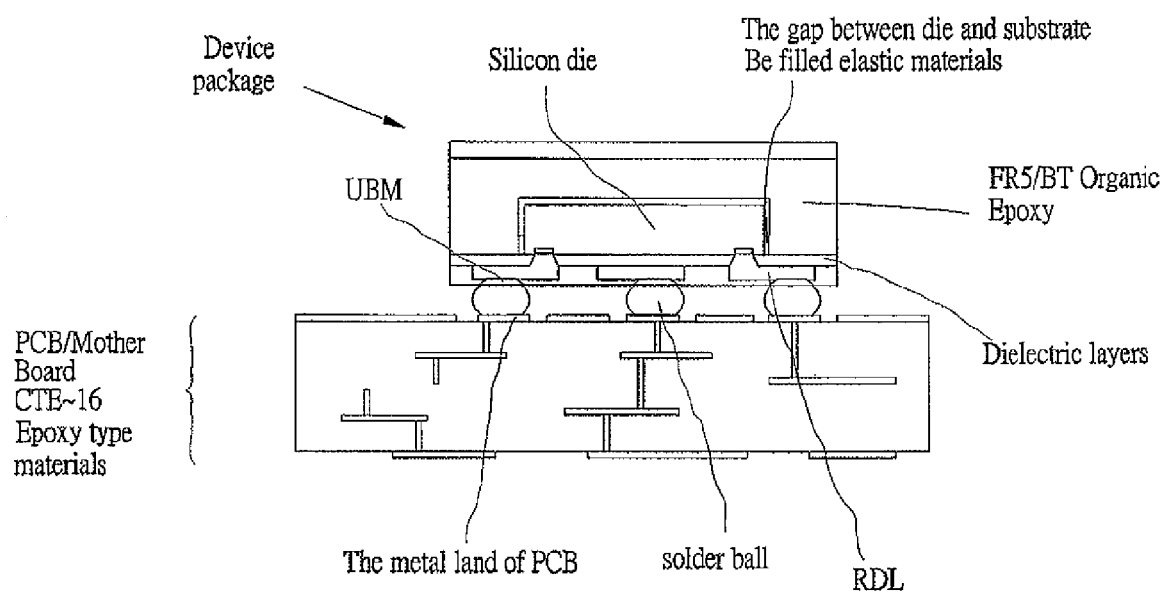
FIG. 6 illustrates a cross-sectional view of the combination of the package attached on the PCB or Mother Board according to the present invention.

Please refer to FIG. 6, it illustrates the major portions that associate with the CTE issue. The silicon die (CTE is 2.3) is packaged inside the package. FR5 or BT organic epoxy type material (CTE~16) is employed as the substrate and its CTE is the same as the PCB or Mother Board. The gap between the die and the substrate is filled with elastic materials to absorb the thermal mechanical stress due to CTE mismatching (between die and the FR5/BT). Further, the dielectric layers 12 include elastic materials to absorb the stress between the die pads and the PCB. The RDL metal is Cu/Au materials and the CTE is around 16 that is the same as the PCB and organic substrate, and the UBM 18 of contact bump be located on the terminal contact metal pads 3 of substrate. The metal land of PCB is Cu, the CTE of Cu is around 16 that is match to the one of PCB. From the description above, the present invention may provide excellent CTE solution for the WLP.

Apparently, CTE matching issue under the build up layers (PCB and substrate) is solved by the present scheme and it provides better reliability (no thermal stress in X/Y direction-on board) and the elastic DL is employed to absorb the Z direction stress. Only one material (Epoxy type) is involves the singulation. The gap between chip edge and cavity sidewall can be used to fill the elastic dielectric materials to absorb the mechanical/thermal stress.

In one embodiment of the invention, the material of the RDL 24 comprises Ti/Cu/Au alloy or Ti/Cu/Ni/Au alloy; the thickness of the RDL 24 is between 2 um_and_15 um. The Ti/Cu alloy is formed by sputtering technique also as seed metal layers, and the Cu/Au or CU/Ni/Au alloy is formed by electroplating; exploiting the electroplating process to form the RDL can make the RDL thick enough to withstand CTE mismatching during temperature cycling. The metal pads 20 can be Al or Cu or combination thereof. If the structure of FO-WLP utilizes SINR as the elastic dielectric layer and Cu as the RDL, according the stress analysis not shown here, the stress accumulated in the RDL/dielectric layer interface is reduced.

Figure 2:
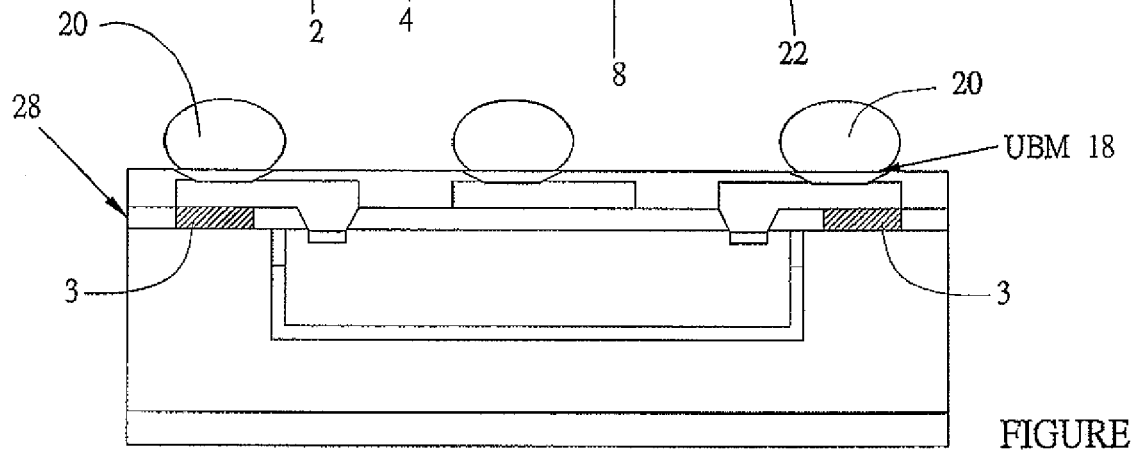
FIG. 2 illustrates a cross-sectional view of a structure of fan-out WLP according to the present invention.

As shown in FIG. 1-3, the RDL 24 fans out of the die and communicates toward the terminal pads 18. It is different from the prior art technology, the die 6 is received within the pre-formed cavity of the substrate, thereby reducing the thickness of the package. The prior art violates the rule to reduce the die package thickness. The package of the present invention will be thinner than the prior art. Further, the substrate is pre-prepared before package. The cavity 4 is pre-determined. Thus, the throughput will be improved than ever.

The present invention discloses a fan-out WLP with reduced thickness and good CTE performance.

The process for the present invention includes providing an alignment tool with alignment pattern formed thereon. Then, the pattern glues is printed on the tool (be used for sticking the surface of dice), followed by using pick and place fine alignment system with flip chip function to re-distribute the known good dies on the tool with desired pitch. The pattern glues will stick the chips on the tool. Subsequently, the die attached materials is printed on the die back side (preferably, the elastic based materials). Then, the panel bonder is used to bond the substrate on to die back side; the upper surface of substrate except the cavities also be stuck on the pattern glues, then vacuum curing and separate the tool with panel wafer.

Alternatively, the die bonder machine with fine alignment is employed, and the die attached materials is dispensed on the cavity of substrate. The die is placed on to the cavity of substrate. The die attached materials is thermally cured to ensure the die is attached on the substrate.

Once the die is re-distributed on the substrate, then, a clean up procedure is performed to clean the dice surface by wet and/or dry clean. Next step is to coat the dielectric materials on the panel, followed by performing vacuum procedure to ensure there is no bubble within the panel. Subsequently, lithography process is performed to open via (contact metal pads) and Al bonding pads and/or the scribe line (optional). Plasma clean step is then executed to clean the surface of via holes and Al bonding pads. Next step is to sputter Ti/Cu as seed metal layers, and then Photo Resistor (PR) is coated over the dielectric layer and seed metal layers for forming the patterns of redistributed metal layers (RDL). Then, the electro plating is processed to form Cu/Au or Cu/Ni/Au as the RDL metal, followed by stripping the PR and metal wet etching to form the RDL metal trace. Subsequently, the next step is to coat or print the top dielectric layer and to open the contact bump via to form the UBM and/or to open the scribe line (optional).

After the ball placement or solder paste printing, the heat re-flow procedure is performed to re-flow on the substrate side (for BGA type). The testing is executed. Panel wafer level final testing is performed by using vertical probe card. After the testing, the substrate is sawed to singular the package into individual units. Then, the packages are respectively picked and placed the package on the tray or tape and reel.

The advantages of the present invention are:

The process is simple for forming Panel wafer type and is easy to control the roughness of panel surface. The thickness of panel (die attached) is easy to be controlled and die shift issue will not occurs during process. The injection mold tool is omitted and warp and CMP polish process will not be introduced either.

The substrate is pre-prepared with pre-form cavity and terminal contact metal pads (for organic substrate); the size of cavity equal to (die size+plus around 50 um to 100 um per/side; it can be used as stress buffer releasing area by filling the elastic dielectric materials to absorb the thermal stress due to the CTE difference between silicon die and substrate (FR5/BT)). The packaging throughput will be increased (manufacturing cycle time was reduced) due to apply the simple build up layers on top the surface of die. The terminal pads are formed on the same surface to the dice active surface.

The dice placement process is the same as the current process. No core paste (resin, epoxy compound, silicone rubber, etc.) filling is necessary for the present invention. CTE mismatching issue is overcome during panel form process and the deepness between die and substrate FR4 is only around ~20-30 um (act as die attached thickness), the surface level of die and substrate can be the same after the die is attached on the cavities of substrate. Only silicone dielectric material (preferably SINR) is coated on the active surface and the substrate (preferably FR45 or BT) surface. The contact pads are opened by using photo mask process only due to the dielectric layer (SINR) is photosensitive layer for opening the contacting open. Vacuum process during SINR coating is used to eliminate the bubble issue during filling the gap between die and side wall of cavity of substrate. The die attached material is printed on the back-side of dice before substrate be bonded together with dice (chips). The reliability for both package and board level is better than ever, especially, for the board level temperature cycling test, it was due to the CTE of substrate and PCB mother board are identical, hence, no thermal mechanical stress be applied on the solder bumps/balls; the previous failure mode (solder ball crack) during temperature cycling on board test were not obvious. The cost is low and the process is simple. It is easy to form the combo package (dual dice package).

Although preferred embodiments of the present invention have been described, it will be understood by those skilled in the art that the present invention should not be limited to the described preferred embodiments. Rather, various changes and modifications can be made within the spirit and scope of the present invention, as defined by the following claims.

Having described the invention, the following is claimed:

1. A method for forming semiconductor device package comprising:
    providing a substrate with a pre-formed die receiving cavity and/or terminal contact pads formed within an upper surface of said substrate;
    using a pick and place fine alignment system to re-distribute known good dice on a carrier tool with desired pitch, wherein said carrier tool includes adhesive material at the periphery area of said carrier tool to adhere said substrate;
    attaching adhesive material on die back side;
    bonding said substrate on to said die back side, and curing then separating said tool from said substrate;
    coating a dielectric layer on said die and substrate, followed by performing vacuum procedure;
    forming an opening to expose a contact pad of said die and/or substrate;
    forming at least one conductive built up layer over said dielectric layer;
    forming a contacting structure over said at least one conductive built up layer;
    forming a protection layer over said at least one conductive built up layer.

2. The method of claim 1, further comprising forming a conductive bump coupled to said contacting structure.

3. The method of claim 1, wherein said dielectric layer includes an elastic dielectric layer, a photosensitive layer, a silicone dielectric based material layer, a polyimides (PI) layer or a silicone resin layer.

4. The method of claim 3, wherein said silicone dielectric based material comprises siloxane polymers (SINR), Dow Corning WL5000 series, or the combination thereof.

5. The method of claim 1, wherein said at least one conductive built up layer is made from an alloy comprising Ti/Cu/Au alloy or Ti/CuNi/Au alloy.

6. The method of claim 1, wherein the material of said substrate includes epoxy type FR5 or FR4.

7. The method of claim 1, wherein the material of said substrate includes BT, silicon, PCB (print circuit board) material, glass or ceramic.

8. The method of claim 1, wherein the material of said substrate includes alloy or metal.

9. The method of claim 8, wherein the material of said substrate includes Alloy42 (42% Ni-58% Fe) or Kovar (29% Ni-17% Co-54% Fe).

10. The method of claim 1, wherein said carrier tool is made of glass.

* * * * *